United States Patent
Chih et al.

(10) Patent No.: US 9,747,159 B2
(45) Date of Patent: Aug. 29, 2017

(54) MRAM SMART BIT WRITE ALGORITHM WITH ERROR CORRECTION PARITY BITS

(71) Applicant: Taiwan Semiconductor Manufacturing Co. Ltd., Hsin-Chu (TW)

(72) Inventors: Yue-Der Chih, Hsin-Chu (TW); Hung-Chang Yu, Hsin-Chu (TW); Kai-Chun Lin, Hsinchu (TW); Chin-Yi Huang, Hsinchu (TW); Laun C. Tran, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/827,591

(22) Filed: Aug. 17, 2015

(65) Prior Publication Data

US 2015/0355963 A1    Dec. 10, 2015

Related U.S. Application Data

(62) Division of application No. 13/917,772, filed on Jun. 14, 2013, now Pat. No. 9,110,829.
(Continued)

(51) Int. Cl.
*G11C 29/00* (2006.01)
*H03M 13/00* (2006.01)
(Continued)

(52) U.S. Cl.
CPC .......... *G06F 11/1056* (2013.01); *G06F 11/10* (2013.01); *G06F 11/1004* (2013.01); *G06F 11/1048* (2013.01); *G06F 11/1052* (2013.01); *G06F 11/141* (2013.01); *G06F 11/1402* (2013.01); *G11C 11/1675* (2013.01);
(Continued)

(58) Field of Classification Search
CPC ............ G06F 11/1056; G06F 11/1048; G06F 11/1004
See application file for complete search history.

(56) References Cited

U.S. PATENT DOCUMENTS 3,742,449 A * 6/1973 Blair ..................... H03M 13/17
                                                    714/761
4,319,356 A * 3/1982 Kocol ................. G06F 11/1076
                                                    714/54
(Continued)

*Primary Examiner* — Joseph D Torres
(74) *Attorney, Agent, or Firm* — Eschweiler & Potashnik, LLC

(57) ABSTRACT

Some embodiments relate to a system that includes write circuitry, read circuitry, and comparison circuitry. The write circuitry is configured to attempt to write an expected multi-bit word to a memory location in a memory device. The read circuitry is configured to read an actual multi-bit word from the memory location. The comparison circuitry is configured to compare the actual multi-bit word read from the memory location with the expected multi-bit word which was previously written to the memory location to distinguish between a number of erroneous bits in the actual multi-bit word and a number of correct bits in the actual multi-bit word. The write circuitry is further configured to re-write the number of erroneous bits to the memory location without attempting to re-write the number of correct bits to the memory location.

20 Claims, 5 Drawing Sheets

Related U.S. Application Data

(60) Provisional application No. 61/732,253, filed on Nov. 30, 2012.

(51) Int. Cl.
*G06F 11/10* (2006.01)
*H03M 13/11* (2006.01)
*G06F 11/14* (2006.01)
*G11C 11/16* (2006.01)
*G11C 13/00* (2006.01)

(52) U.S. Cl.
CPC ......... *G11C 11/1677* (2013.01); *H03M 13/11* (2013.01); *H03M 13/611* (2013.01); *G11C 2013/0076* (2013.01)

(56) References Cited

U.S. PATENT DOCUMENTS

| | | | | |
|---|---|---|---|---|
| 4,597,083 A * | 6/1986 | Stenerson | ............ | H03M 13/15 714/753 |
| 5,509,132 A * | 4/1996 | Matsuda | ............. | G11C 7/1051 711/3 |
| 5,565,695 A * | 10/1996 | Johnson | ................... | G11C 11/16 257/295 |
| 5,812,565 A * | 9/1998 | Fendt | ...................... | G11C 29/88 714/6.1 |
| 7,143,332 B1 * | 11/2006 | Trimberger | ......... | G06F 11/1044 360/26 |
| 2003/0023923 A1 * | 1/2003 | Davis | .................. | G06F 11/1008 714/763 |
| 2003/0218925 A1 * | 11/2003 | Torjussen | ................ | G06F 11/08 365/200 |
| 2004/0153902 A1 * | 8/2004 | Machado | ............. | G06F 11/1068 714/710 |
| 2004/0255225 A1 * | 12/2004 | Takai | ................... | G06F 11/1068 714/763 |
| 2005/0229076 A1 * | 10/2005 | Riho | ................... | G06F 11/1012 714/758 |
| 2007/0297223 A1 * | 12/2007 | Chen | ....................... | G11C 11/16 365/173 |
| 2008/0294934 A1 * | 11/2008 | Park | .................... | G06F 11/1012 714/6.2 |
| 2009/0106505 A1 * | 4/2009 | Rao | ..................... | G06F 11/1044 711/154 |
| 2009/0287982 A1 * | 11/2009 | Kabelac | ............... | G11B 27/107 714/771 |
| 2011/0157985 A1 * | 6/2011 | Sudo | .................. | G06F 11/1048 365/185.09 |

* cited by examiner

"0"
Low resistance state

"1"
High resistance state

MRAM SMART BIT WRITE ALGORITHM WITH ERROR CORRECTION PARITY BITS

REFERENCE TO RELATED APPLICATIONS

This application is a Divisional of U.S. application Ser. No. 13/917,772 filed on Jun. 14, 2013, which claims priority to U.S. Provisional Application No. 61/732,253 filed on Nov. 30, 2012, the contents of which are incorporated by reference in their entirety.

BACKGROUND

Computer memory is a technology consisting of semiconductor devices arranged to retain digital data and is a fundamental component of computers. Magnetic random access memory (MRAM) is one type of memory garnering attention in recent years. MRAM is non-volatile meaning that it retains its stored data even when power is disconnected from the device, whereas volatile memory loses its stored data when power is disconnected. Compared to existing volatile memories, MRAM can offer similar performance as static random access memory (SRAM), and similar density as dynamic random access memory (DRAM), albeit with much lower power consumption than DRAM. Compared to flash memory, which is also non-volatile, MRAM is much faster and suffers little or no degradation over time. It is this combination of features that some suggest make it the "universal memory", able to replace SRAM, DRAM, EEPROM, and flash.

DETAILED DESCRIPTION

This description of the exemplary embodiments is intended to be read in connection with the accompanying drawings, which are to be considered part of the entire written description. In the description, terms concerning coupling and the like, such as "coupled", "connected" and "interconnected," refer to a relationship wherein structures communicate with one another either directly or indirectly through intervening structures unless expressly described otherwise.

Figure 1A:
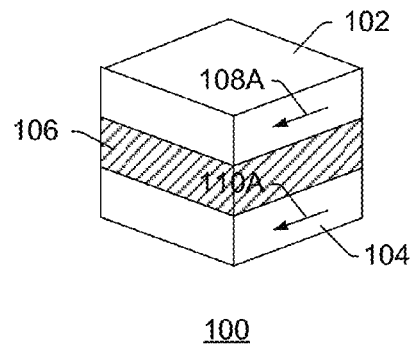
FIGS. 1A and 1B show perspective views of an MRAM memory cell storing different states in accordance with some embodiments.
Figure 1B:
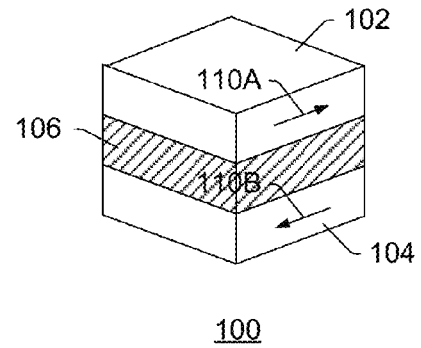

Aspects of the present disclosure relate to improved magnetic random access memory (MRAM) techniques. FIGS. 1A-1B show an MRAM cell 100 that includes an upper ferromagnetic plate 102 and a lower ferromagnetic plate 104, which are separated by a thin insulating layer 106 also referred to as a tunnel barrier layer. One of the two ferromagnetic plates, for example the lower plate 104, is a magnetic layer that is pinned to an antiferromagnetic layer. The other ferromagnetic plate, for example the upper plate 106, is a free magnetic layer that can have its magnetic field changed to one of two or more values to store one of two or more corresponding data states. In some embodiments, the MRAM cell 100 is a Spin-Transfer-Torque (STT) MRAM cell. STT MRAM uses spin-aligned or polarized electron flow to turn the free magnetic layer with respect to the pinned magnetic layer. Overall, the STT MRAM requires much less write current than conventional or toggle MRAM.

Due to the magnetic tunnel effect, the electrical resistance of the MRAM cell 100 changes in accordance with the magnetic fields stored on the two plates. For example, in FIG. 1A, the magnetic fields of the upper and lower ferromagnetic plates 102, 104 are aligned (see arrows 108A, 110A in FIG. 1A), resulting in a low-resistance state, which is assigned to a logical "0" state. In FIG. 1B, a current has been passed through the cell 100 to induce a change in the magnetic field of the magnetic free layer (e.g., upper ferromagnetic plate 102). Thus, after this write operation, the magnetic fields in the upper and lower layers oppose one another (see arrows 110A, 110B in FIG. 1B), which gives rise to a high resistance state. Hence, by measuring the electrical resistance between the two plates 102, 104, read circuitry coupled to the memory cell 100 can discern between "0" and "1" data states. It is also possible for a cell to store more than two states (e.g., read circuitry can discern between more than two discrete resistance ranges stored in the cell), such that the cell stores a multi-bit digital value.

Figure 2:
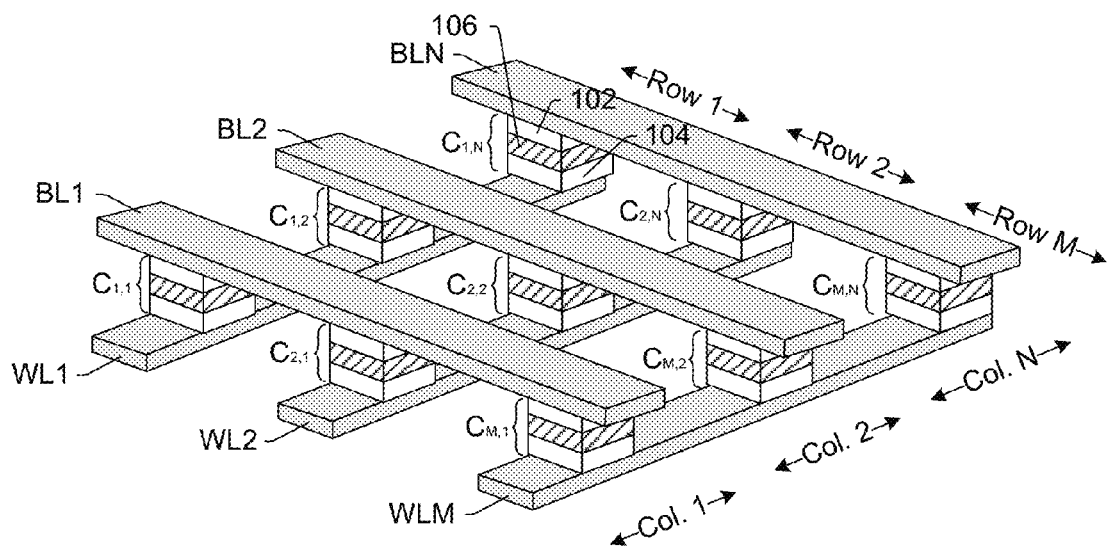
FIG. 2 shows an MRAM array in accordance with some embodiments.

As shown in FIG. 2, a number of these ferroelectric memory cells 100 can be arranged in an array 200, which includes cells arranged M rows (words) and N columns (bits), wherein individual cells are labeled $C_{row-column}$. Wordlines WL1, . . . , WLM extend across respective rows of memory cells and bitlines BL1, . . . , BLN extend along columns.

To write data (e.g., a digital word) to a row of cells, a wordline is asserted to select a row and appropriate biases are applied to the individual bitlines to write respective values to the respective cells of the selected row. For example, to write a digital word of "1 . . . 0" to the memory cells in Row1, WL1 can be pulsed high (e.g., 1.2~2.2 volts) to select cells $C_{1,1}$ through $C_{1,N}$. At the same time, BL1 is biased with a logical "1" (e.g., to write a "1" to $C_{1,1}$), . . . , and BLN is biased with a logical "0" (e.g., to write a "0" to $C_{1,N}$). The wordline voltages of the other rows (e.g., Row2-RowM) typically remain deactivated (e.g., 0 volts), such that data is written to only the selected row (e.g., Row1), although multi-row writes can also occur in some implementations.

When data is written to or read from multiple cells along a row (e.g., a multi-bit word), data errors can occur for one or more cells (e.g., one or more bits) along the row due to a number of factors. For example, defects in the cells, small fluctuations in bitline or wordline voltages applied to the individual cells during memory accesses, or small manufacturing variations across the memory array can lead to erroneous bits being written to the memory array. In MRAM in particular, when all bits of a multi-bit word are written, some of the bits of the word might be affected by a "back hopping" effect, wherein the affected bits reverse their states shortly after being written. Further, this back hopping effect might be more pronounced as the memory device undergoes more write cycles (e.g., as the memory device ages).

In view of these back-hopping issues, the present disclosure provides improved read and write operations—so called smart MRAM bit write operations. In these improved read and write operations, a multi-bit word is initially written to memory, and is then subsequently checked to verify whether its bits were written correctly. While correctly written bits are left unperturbed, any erroneous bits in the word are re-written. In other words, the erroneous bits are re-written in a bit-wise write operation directed solely at the erroneous bits. Because the correctly written bits are not re-written, this operation can limit "back hopping" somewhat for cells that store correct data. This operation also limits degradation of the individual memory cells over time as fewer write operations are carried out compared to techniques where full words are always re-written to memory. If erroneous bits are repeatedly checked and remain erroneous over multiple re-write operations (i.e., "sticky" and/or "hard fail" erroneous bits), the present disclosure also provides error correction coding (ECC) techniques to attempt to correct those sticky and/or hard fail bits.

Figure 3:
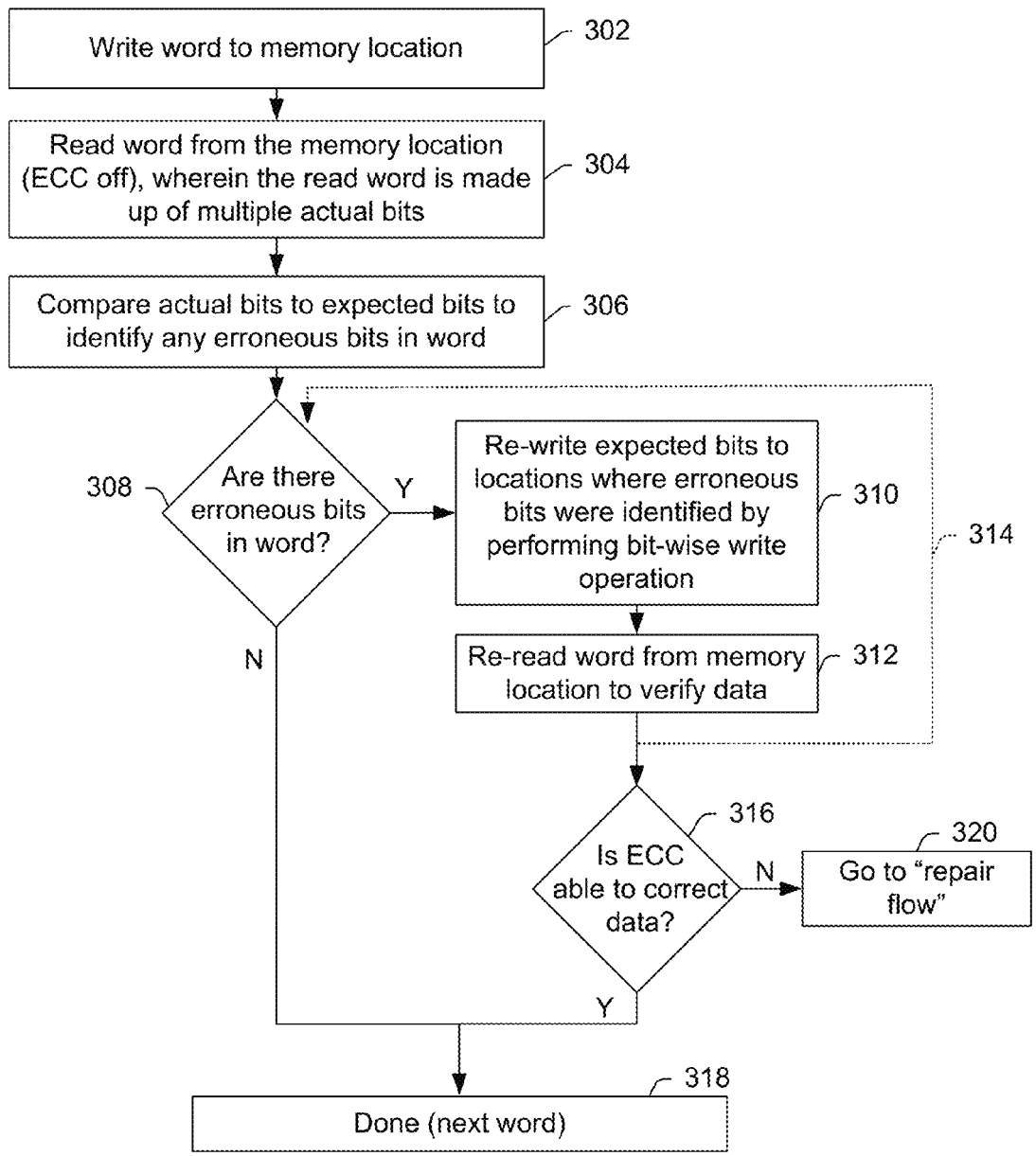
FIG. 3 shows a flow chart illustrating some embodiments of a method for a MRAM smart bit write operation.

FIG. 3 shows some embodiments of a method of performing a smart bit write operation in MRAM. The method is illustrated and now described as a series of acts or blocks. It will be appreciated that some of the acts or blocks may be further subdivided into multiple acts or blocks in some implementations, or may multiple illustrated acts or blocks can be combined in other implementations. Additional un-illustrated acts or blocks may also be present, and/or illustrated acts or blocks may be omitted in some implementations. Also, the order of the acts or blocks may be re-ordered in some embodiments. All such changes are contemplated as falling within the scope of the present disclosure.

FIG. 3's method 300 starts at 302 when a word, which is made up of multiple expected bits, is written to a memory location. For example, for purposes of clarity, consider an example where the word to be written is an 8-bit word made of expected bits "10110010". Due to programming errors, defects, process variation, and/or other unexpected or unpredictable conditions, the data bits that are actually written to the word can deviate from these expected bits.

At 304, the method 300 reads the multiple actual bits from the memory location. Typically error correction coding (ECC) is not used at this point to conserve system resources. Continuing with the example described above, consider that the actual bits read from memory are "11000111".

At 306, the method compares the actual bits read from memory to the expected bits which were attempted to be written to memory, thereby allowing identification of any erroneous bits in the word. In our example with expected bits "10110010" and actual bits "11000111", the following underlined bits in the actual bits are erroneous bits "1<u>1</u>000<u>111</u>".

If there are erroneous bits in the word (Y at 308), the method continues to 310 where it re-writes the expected bit(s) to the bit location(s) where erroneous bits were identified. This occurs by performing a bit-wise write operation to correct the erroneous bits. Continuing with the example, the following underlined bits in the expected bits are re-written to the memory location where the word is stored: "1<u>0</u>1100<u>10</u>", while the non-underlined bits are not re-written. Because this bit-wise write operation leaves the data states of the correct bits (not underlined) unperturbed, the odds of back-hopping for the correct bits is reduced and wear on these correct cells is limited.

After block 310, the method then continues to 312, where the data in the word is verified, optionally with ECC enabled. That is, the actual bits are re-read from the memory location, and are compared to the expected bits. Note that, in some embodiments, blocks 310 and 312 can continue in iterative fashion (see line 314) in an attempt to correct any erroneous bits. For purposes of the example, we will assume that the method is unable to correct a single bit in the word, and thus the single bit is a hard fail. In our example, we'll assume that ECC can correct the single erroneous bit (Y at 316), so method 300 moves on to the next word in 318.

If the actual bits are ultimately uncorrectable using ECC (N at 316), a repair flow can be used in 320 in which an address of the entire word is mapped to a different word reserved for acting as a replacement word, or wherein addresses of the individual erroneous cells (individual erroneous bits) are mapped to different individual bits reserved for acting as replacement bits. Note that if there are no erroneous bits in the word (N at 308), the method can simply continue on to process another word in 308.

Thus, the method 300 provides techniques for checking whether data is correctly written (or read) from memory, and for corrected erroneous bits in a manner that limits back-hopping and wear on the device.

Figure 4:
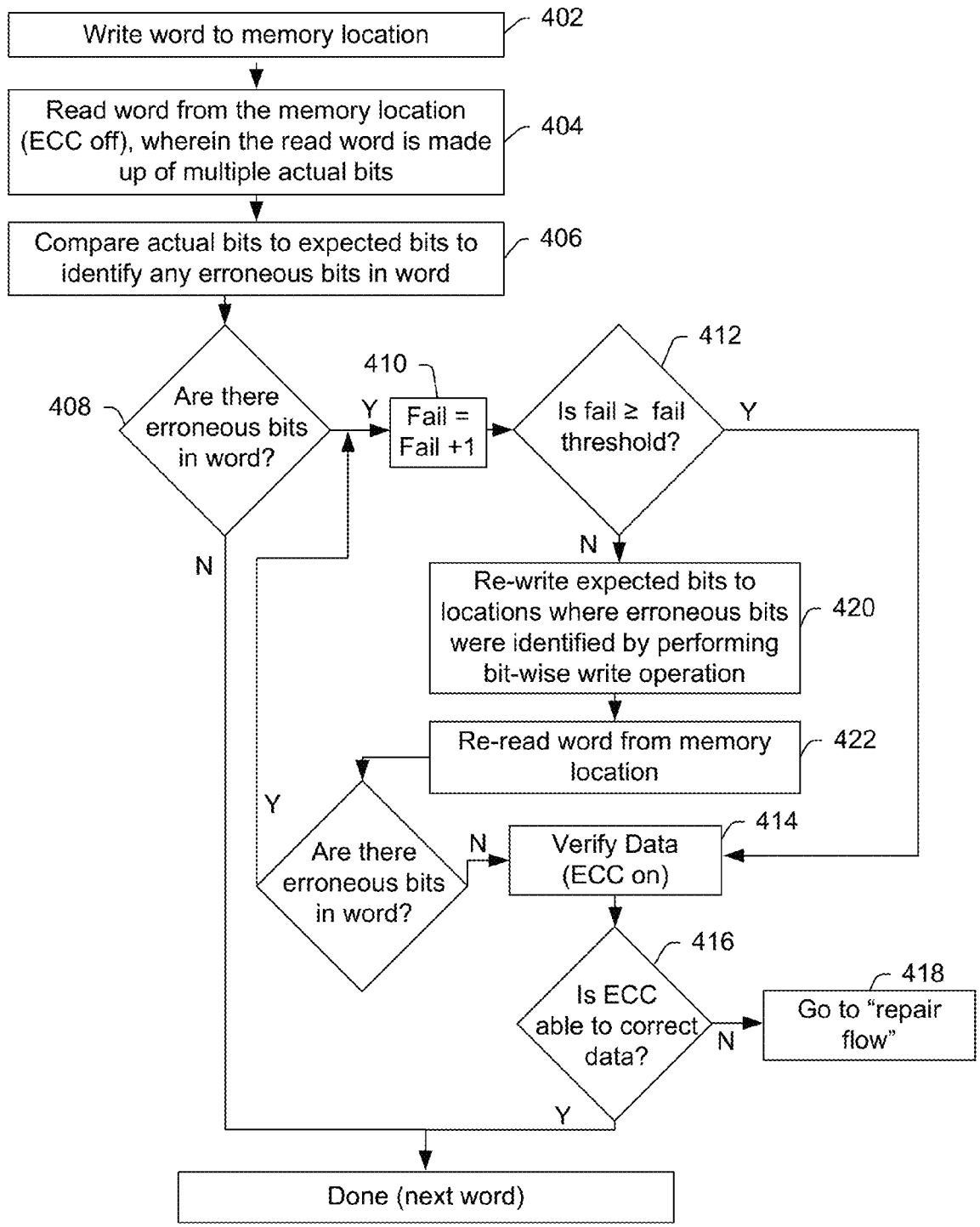
FIG. 4 shows a flow chart illustrating some embodiments of a method for a MRAM smart bit write operation.

FIG. 4 shows some embodiments of another method of performing a smart bit write operation in MRAM. FIG. 4's method 400 starts at 402 when a word, which is made up of multiple expected bits, is written to a memory location. Again, consider an example where the word to be written is an 8-bit word made of expected bits "10110010".

At 404, the method 400 reads the word from the memory location. Typically error correction coding (ECC) is not used at this point to conserve system resources. This read word includes multiple actual bits read from the memory location. Continuing with the example described above, consider that the actual bits read from memory are "11000111".

At 406, the method compares the actual bits read from memory to the expected bits which were written to memory to thereby identify any erroneous bits in the word. In our example with expected bits "10110010" and actual bits "11000111", the following underlined bits in the actual bits are erroneous bits "1<u>1</u>000<u>111</u>".

If there are erroneous bits in the word (Y at 408), the method continues to 410 where it increments a fail counter.

In 412, the method checks whether the fail count value in 410 meets or exceeds a predetermined fail threshold. A designer can set this predetermined fail threshold to control how many times the method will attempt to re-write data to a given word. For example, if accuracy of data is of utmost importance and write speed is of little importance, the fail threshold can be set to a high value; whereas if fast write speeds are paramount, then the fail threshold can be set to a low value. It will be appreciated that the method could alternatively check whether the fail count value is less than or equal to a predetermined fail threshold (e.g., in cases where the fail count is decremented for each fail, rather the being incremented for each fail as show in 410), or use other suitable relationships.

If the fail count meets or exceeds the fail threshold (Y in 412), too many attempts for correcting the data have been attempted to be efficient, and the method performs one last read operation and data comparison while employing ECC in block 414.

At 416, the method determines whether ECC is able to correct the erroneous bits, by noting whether the number of erroneous bits favorably compares to a correctable bitsize of the ECC algorithm used. For example, if the number of ECC bits are sufficient to only correct a single bit error, the method 400 can compare the number of erroneous bits to a predetermined ECC correctable bitsize of one. If the number of erroneous bits is greater than one in this example, then the ECC algorithm cannot correct the error (N in 416) and method proceeds to 418 to attempt to repair or remap the faulty memory location. On the other hand, if the data is correctable (Y at 416), the data is corrected and the next word can be processed.

Going back to 412, if the fail count is less than the fail threshold (N at 412) the method continues to attempt to correct the bits by re-writing the erroneous bits to the word. In 420, the method re-writes the expected bits to the bit locations where erroneous bits were identified. This occurs by performing a bit-wise write operation to correct the erroneous bits. Continuing with the example, the following underlined bits in the expected bits are re-written to the word: "1 0110 010", while the non-underlined bits are not re-written. The method then continues to 422, where the data in the word is re-read, and the method again checks whether the erroneous bits are present in 424 by comparing the expected bits to actual bits re-read from the memory location. Method 400 continues re-reading and re-writing this iterative manner until the value of the fail counter is greater than or equal to the predetermined fail threshold (Y at 412) or until all bits are correct (N at 424).

Figure 5:
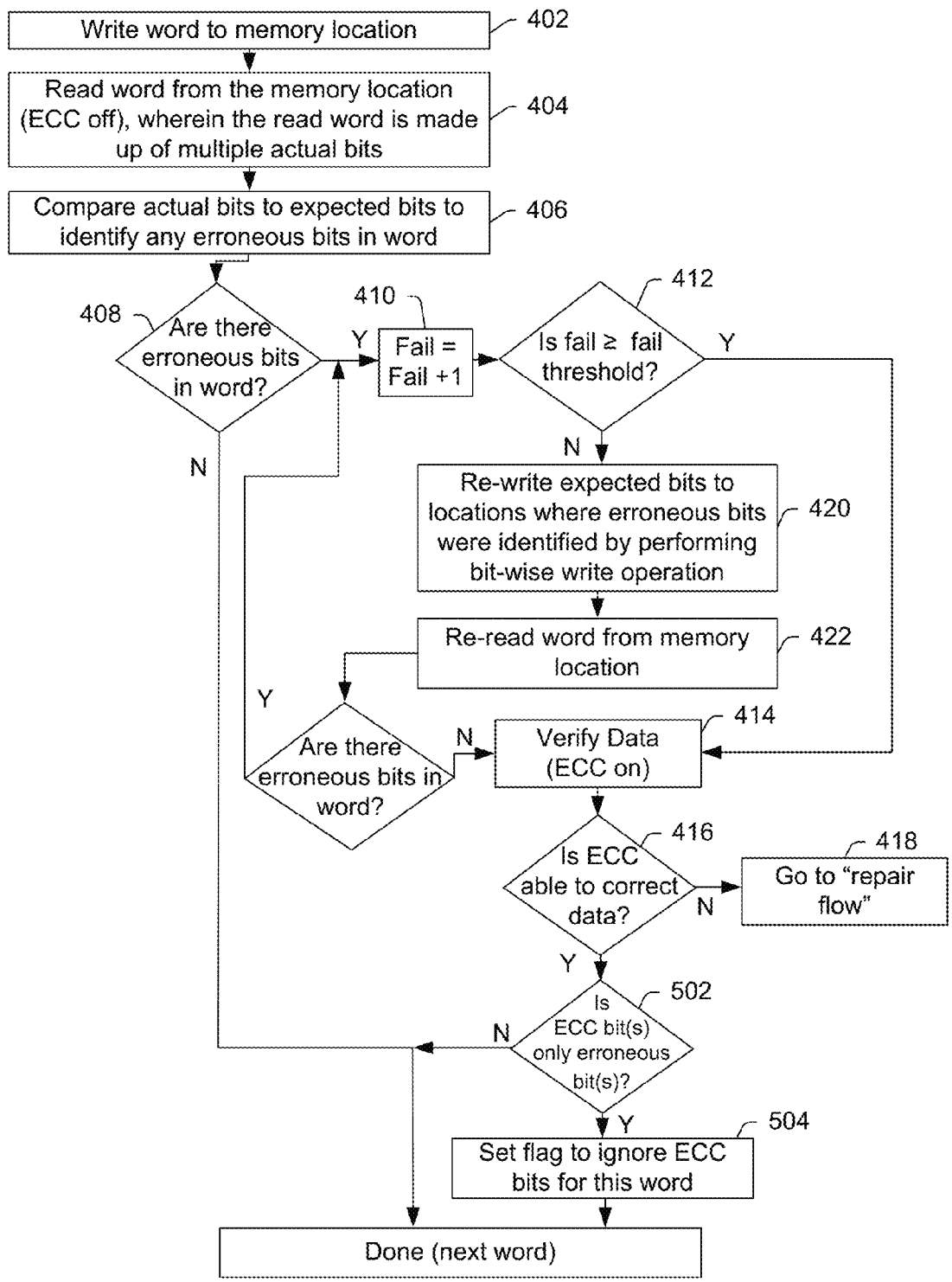
FIG. 5 shows a flow chart illustrating some embodiments of a method for a MRAM smart bit write operation.

FIG. 5 shows some embodiments of another method of performing a smart bit write operation in MRAM. FIG. 5's method is similar to that of FIG. 4, except for blocks 502 and 504, which deal with how errors are identified and treated. In block 502 of FIG. 5, after erroneous bits have been identified within a word, the method 500 determines whether the erroneous bits correspond solely to ECC bits in the word. For example, if the first 7 bits of an 8-bit word are data bits and the last bit is an ECC bit, the method can discern whether a single-bit error is confined to the ECC bit. If so (Y at 502), the method sets a flag to ignore the ECC bit (s) for this word, particularly if several unsuccessfully attempts have been made to correct the ECC bit—suggesting that the ECC bit is a hard fail. The method also can continue to rely on the data in the remaining 7 bits of the word, even though they will be somewhat less reliable in that they are no longer protected by the (now erroneous) ECC bit. If not (N at 502), the method continues to the next word.

Figure 6:
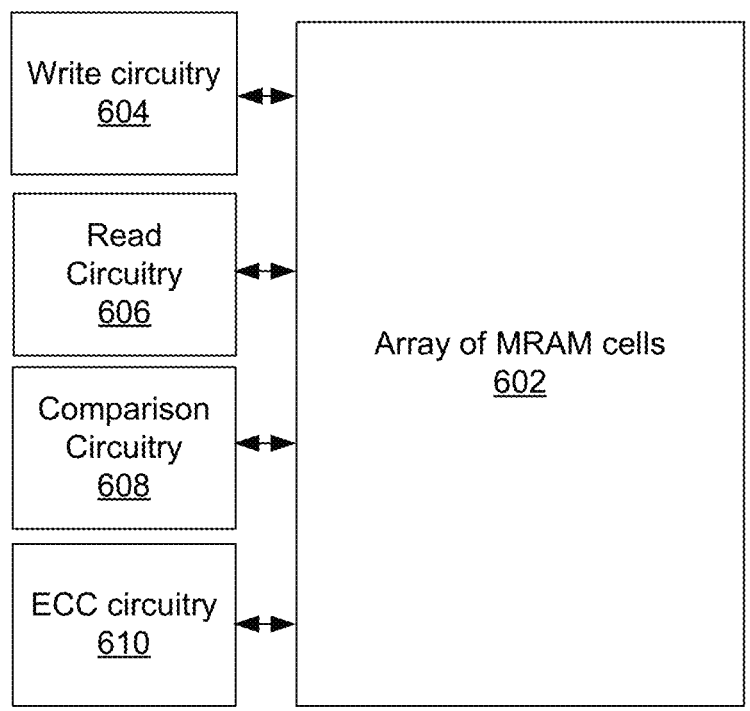
FIG. 6 shows an MRAM memory device with circuitry to perform smart bit write operations.

FIG. 6 shows an MRAM device 600 in accordance with some embodiments. The MRAM device 600 includes a memory array 602 made up of a number of MRAM cells, typically arranged in rows and columns. Write circuitry 604 can write multi-bit words (or individual bits) into the array 602, and read circuitry 606 can read the multi-bit words from the array 602. Comparison circuitry 608 compares the multi-bit word read from the array 602 with an expected multi-bit word which was previously written to the array 602 to determine a number of erroneous bits in the multi-bit word. Write circuitry 604 then writes the number of erroneous bits to memory in a bit-wise fashion until the number of erroneous bits in the multi-bit word is less than or equal to a bitsize correctable by an error correction code. Error correction circuitry 610 corrects the erroneous bits in the multi-bit word using the error correction code. In some embodiments, a first MRAM cell of the memory array 602 which has been written to more times is more likely to correspond to an erroneous bit than a second MRAM cell of the memory array 602 which has been written to fewer times. The MRAM device 600 can also be configured to carry out other methods described in this specification.

Therefore, it will be appreciated that some aspects of the present disclosure relate to a system that includes write circuitry, read circuitry, and comparison circuitry. The write circuitry is configured to attempt to write an expected multi-bit word to a memory location in a memory device. The read circuitry is configured to read an actual multi-bit word from the memory location. The comparison circuitry is configured to compare the actual multi-bit word read from the memory with the expected multi-bit word which was previously written to the memory to distinguish between a number of erroneous bits in the actual multi-bit word and a number of correct bits in the actual multi-bit word. The write circuitry is further configured to re-write the number of erroneous bits to the memory location without attempting to re-write the number of correct bits to the memory location.

Other embodiments relate to a system including write circuitry, read circuitry, and comparison circuitry. The write circuitry is configured to attempt to write an expected multi-bit word to a memory location in a memory device. The read circuitry is configured to read an actual multi-bit word from the memory location. The comparison circuitry is configured to compare the actual multi-bit word read from the memory with the expected multi-bit word to determine a number of erroneous bits in the actual multi-bit word. The write circuitry is further configured to re-write the number of erroneous bits to the memory location until the number of erroneous bits in the memory location is less than or equal to a pre-determined bitsize.

Still other embodiments relate to a system including write circuitry, read circuitry, and comparison circuitry. The write circuitry is configured to attempt to write an expected multi-bit word to a memory location in a memory device. The read circuitry is configured to read an actual multi-bit word from the memory location. The comparison circuitry is configured to compare the actual multi-bit word read from the memory with the expected multi-bit word to distinguish between a number of erroneous bits in the actual multi-bit word and a number of correct bits in the actual multi-bit word. The write circuitry is further configured to re-write the number of erroneous bits to the memory location until the number of erroneous bits in the memory location is less than or equal to a pre-determined bitsize and without attempting to re-write the number of correct bits to the memory location.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third" and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A system, comprising:
    write circuitry configured to attempt to write an expected multi-bit word to a memory location in a memory device;
    read circuitry configured to read an actual multi-bit word from the memory location;
    comparison circuitry configured to compare the actual multi-bit word read from the memory location with the expected multi-bit word to identify erroneous bits and correct bits in the actual multi-bit word and determine a number of erroneous bits in the actual multi-bit word;
    wherein the write circuitry is further configured to re-write the erroneous bits as corrected bits to the memory location until the number of erroneous bits in the memory location is less than or equal to a pre-determined number that defines the maximum number of correctable bits for an error correction code; and
    a counter configured to be incremented to a count when the erroneous bits are identified in the actual multi-bit word, and compare the count to a fail threshold, and when the fail threshold is not met, the read circuitry is further configured to reread at least one erroneous bit and the write circuitry is further configured to rewrite the at least one erroneous bit as at least one corrected bit in an iterative fashion.

2. The system of claim 1, further comprising:
    error correction circuitry configured to correct the pre-determined number of erroneous bits using the error correction code.

3. The system of claim 1, wherein the comparison circuitry comprises an XOR comparison block.

4. The system of claim 1, wherein a first memory cell of the memory device which has been written to more times is more likely to correspond to an erroneous bit than a second memory cell of the memory device which has been written to fewer times.

5. The system of claim 1, wherein the memory device includes an array of magnetic random access memory (MRAM) cells.

6. The system of claim 5, wherein an MRAM cell includes:
    a first ferromagnetic plate;
    a second ferromagnetic plate; and
    an insulting layer separating the first and second ferromagnetic plates.

7. The system of claim 6, wherein the MRAM cell further comprises:
    an anti-ferromagnetic layer pinned to the first ferromagnetic plate;
    wherein the second ferromagnetic plate is a free layer configured to have its magnetic field changed to one of two or more values to store one of two or more corresponding date states in the MRAM cell.

8. The system of claim 1, wherein the write circuitry is configured to selectively cease writing of the number of erroneous bits as corrected bits to the memory location based on the fail threshold being met by the count.

9. A system, comprising: write circuitry configured to attempt to write an expected multi-bit word to a memory location in a memory device;
    read circuitry configured to read an actual multi-bit word from the memory location;
    comparison circuitry configured to compare the actual multi-bit word read from the memory location with the expected multi-bit word to identify erroneous bits and correct bits in the actual multi-bit word and determine a number of erroneous bits in the actual multi-bit word;
    wherein the write circuitry is further configured to re-write the erroneous bits as corrected bits to the memory location until the number of erroneous bits in the memory location is less than or equal to a pre-determined number that defines the maximum number of correctable bits for an error correction code; and a counter configured to be incremented to a count when the erroneous bits are identified in the actual multi-bit word, and compare the count to a fail threshold, and when the fail threshold is not met, the read circuitry is further configured to reread at least one erroneous bit and the write circuity is further configured to rewrite the at least one erroneous bit as at least one corrected bit in an iterative fashion
    wherein the memory device includes an array of magnetic random access memory (MRAM) cells.

10. The system of claim 9, wherein an MRAM cell includes:
    a first ferromagnetic plate;
    a second ferromagnetic plate; and
    an insulating layer separating the first and second ferromagnetic plates.

11. The system of claim 10, wherein the MRAM cell further comprises:
    an anti-ferromagnetic layer pinned to the first ferromagnetic plate;
    wherein the second ferromagnetic plate is a free layer configured to have its magnetic field changed to one of two or more values to store one of two or more corresponding date states in the MRAM cell.

12. The system of claim 9, wherein a first memory cell of the memory device which has been written to more times is more likely to correspond to an erroneous bit than a second memory cell of the memory device which has been written to fewer times.

13. The system of claim 9, further comprising:
    error correction circuitry configured to correct the pre-determined number of erroneous bits using the error correction code.

14. The system of claim 9, wherein the comparison circuitry comprises an XOR comparison block.

15. A system, comprising: write circuitry configured to attempt to write an expected multi-bit word to a memory location in a memory device;
    read circuitry configured to read an actual multi-bit word from the memory location;
    comparison circuitry configured to compare the actual multi-bit word read from the memory location with the expected multi-bit word to identify erroneous bits and correct bits in the actual multi-bit word and determine a number of erroneous bits in the actual multi-bit word;
    wherein the write circuitry is further configured to re-write the erroneous bits as corrected bits to the memory location until the number of erroneous bits in the memory location is less than or equal to a pre-determined number that defines the maximum number of correctable bits for an error correction code; and
    a counter configured to be incremented to a count when the erroneous bits are identified in the actual multi-bit word, and compare the count to a fail threshold, and when the fail threshold is not met, the read circuitry is further configured to reread at least one erroneous bit and the write circuity is further configured to rewrite the at least one erroneous bit as at least one corrected bit in an iterative fashion;

wherein the write circuitry is configured to selectively cease writing of the number of erroneous bits as corrected bits to the memory location based on the fail threshold being met by the count.

16. The system of claim 15, wherein a first memory cell of the memory device which has been written to more times is more likely to correspond to an erroneous bit than a second memory cell of the memory device which has been written to fewer times.

17. The system of claim 15, further comprising:
    error correction circuitry configured to correct the predetermined number of erroneous bits using the error correction code.

18. The system of claim 15, wherein the comparison circuitry comprises an XOR comparison block.

19. The system of claim 15, wherein the memory device includes an array of magnetic random access memory (MRAM) cells.

20. The system of claim 19, wherein an MRAM cell includes:
    a first ferromagnetic plate;
    a second ferromagnetic plate;
    an insulating layer separating the first and second ferromagnetic plates; and
    an anti-ferromagnetic layer pinned to the first ferromagnetic plate;
    wherein the second ferromagnetic plate is a free layer configured to have its magnetic field changed to one of two or more values to store one of two or more corresponding date states in the MRAM cell.

* * * * *